(12) United States Patent
Lescourret

(10) Patent No.: US 6,894,490 B2
(45) Date of Patent: May 17, 2005

(54) DEVICE AND METHOD FOR MEASURING MAGNETIC FIELD(S) WITH CALIBRATION SUPERIMPOSED ON THE MEASUREMENT AND CORRESPONDING USES

(75) Inventor: Jean-Louis Lescourret, Merignac (FR)

(73) Assignee: Thales Avionics S.A., Velizy Villacoublay (FR)

( * ) Notice: Subject to any disclaimer, the term of this patent is extended or adjusted under 35 U.S.C. 154(b) by 13 days.

(21) Appl. No.: 10/257,536

(22) PCT Filed: Apr. 6, 2001

(86) PCT No.: PCT/FR01/01061
§ 371 (c)(1),
(2), (4) Date: Oct. 15, 2002

(87) PCT Pub. No.: WO01/79873
PCT Pub. Date: Oct. 25, 2001

(65) Prior Publication Data
US 2003/0151404 A1 Aug. 14, 2003

(30) Foreign Application Priority Data
Apr. 14, 2000 (FR) .............................................. 00 04860

(51) Int. Cl.⁷ .......................... G01R 33/12; G01R 35/00
(52) U.S. Cl. .................. 324/228; 324/207.13; 324/202; 324/260
(58) Field of Search .......................... 324/260, 207.13, 324/207.17, 228, 202, 232; 702/94, 104

(56) References Cited

U.S. PATENT DOCUMENTS

| | | | |
|---|---|---|---|
| 4,394,831 A | * | 7/1983 | Egli et al. .................. 89/41.19 |
| 4,613,866 A | | 9/1986 | Blood |
| 4,849,695 A | | 7/1989 | Muller et al. |
| 5,694,041 A | | 12/1997 | Lescourret |
| 5,847,976 A | | 12/1998 | Lescourret |

* cited by examiner

*Primary Examiner*—Jay Patidar
*Assistant Examiner*—Reena Aurora
(74) *Attorney, Agent, or Firm*—Oblon, Spivak, McClelland, Maier & Neustadt, P.C.

(57) ABSTRACT

A device for measuring magnetic field(s). The device includes at least one measurement acquisition pathway including a measurement current generator, a coil, a measurement resistor, at least one amplifier, and at least one antialiasing filter, delivering a measurement voltage. The device for measuring magnetic field(s) includes a device for determinating at least one electrical quantity representative of the acquisition pathway. The device for determining includes a mechanism for injecting a predetermined calibration current, including at least two frequency terms at at least two frequencies distinct from those of a measurement current, the calibration current being superimposed on the measurement current. The device for measuring magnetic field(s) also includes a calculation device delivering an estimate of the at least one electrical quantity at the frequency or frequencies of the measurement current.

13 Claims, 4 Drawing Sheets

DEVICE AND METHOD FOR MEASURING MAGNETIC FIELD(S) WITH CALIBRATION SUPERIMPOSED ON THE MEASUREMENT AND CORRESPONDING USES

The domain of the invention is that of the measurement of magnetic field(s).

More precisely, the invention relates to the accurate measurement of magnetic fields and in particular the calibration of the measurement means implemented.

The obtaining of magnetic measurements of high accuracy has always required the implementation of precision components, which have to exhibit considerable qualities of stability over time (very small long-term drift) and with temperature (very small thermal drift). Specifically, the components of a circuit for measuring current for example, must have an accuracy at least equal to, and preferably better, than that required for the measurement.

A drawback of this prior art technique is that these precision components are very expensive.

Another drawback of this prior art technique is that these components must generally be thermostatically controlled and must meet severe specifications with regard to aging.

A favored domain of the present invention is the determination of the orientation of a mobile system with respect to a frame of reference, for example of a helmet viewfinder used in fighter aircraft or combat helicopters. The manner of operation of such a system is recalled briefly below: via an ancillary collimator device, the pilot sees, through his semi-reflecting visor built into the helmet, on the viewing axis, the image of a reticle projected to infinity superimposed with the outside scene. When he wants to designate a target, the pilot makes this reticle coincide with the target and signals that coincidence is achieved, by means for example of a push-button control provided for this purpose.

So long as the exact angular position of the helmet is referenced, at the moment of signaling, it is possible to determine with respect to the aircraft, the direction of aim and to designate the objective to a weapon system, or to point an optical system for example in this direction.

A device for measuring orientation and position of the helmet of the pilot in a reference frame tied to the aircraft can consist of an orientation and position sensor made up of three orthogonal electromagnetic coils and placed on the helmet, and of an emitter, situated at a fixed point of the cabin, and made up of three other electromagnetic coils. The process then consists in passing an electric current through each coil of the emitter (forming a substantially orthogonal fixed trihedron). These currents give rise to three magnetic fields which are sensed by the coils of the sensor (forming a substantially orthogonal mobile trihedron tied to the helmet). The analysis of these magnetic fields makes it possible to determine the position and the orientation of the mobile trihedron with respect to the fixed trihedron.

In this domain of application, it is imperative to obtain an accurate measurement of the magnetic fields emitted by the fixed emitter, and detected by the sensor tied to the helmet, so as to accurately designate, to a weapon system, the objective selected by the pilot.

Hitherto, components of high accuracy, sometimes thermostatically controlled, which are able to operate within a wide time duration, have been used for this measurement.

A drawback of this prior art technique is that, even with components of high quality and hence of very high complexity and very high cost, it is difficult to attain the very high accuracy required by this domain of application.

Another drawback of this prior art technique is that, even with components of high quality and of very high cost, it is difficult to maintain a high level of accuracy over time, on account of the aging of the components.

Calibration techniques have been proposed, in order to limit these drawbacks. However, the calibration phases presuppose, according to these techniques, the temporary interruption of emission, and hence of the operation of the sensor. This interruption is not acceptable in numerous situations (decrease in the signal-to-noise ratio), and in particular in the case discussed above of military equipment, where the signal-to-noise ratio must necessarily be optimized so as to thereby obtain the maximum accuracy.

The objective of the invention is in particular to alleviate these drawbacks of the prior art.

More precisely, an object of the invention is to provide a measurement of magnetic field(s) with high accuracy, while preserving this accuracy over time and throughout the temperature domain.

Another objective of the invention is to obtain a measurement of magnetic field(s) with high accuracy with low-cost elements, and in particular by implementing resistors of medium or low quality, not exhibiting any particular specification in regard to aging, or any conditions regarding drifting.

Yet another objective of the invention is to provide a device for accurate measurement of magnetic field(s) which can operate continuously and which does not require any preliminary and/or periodic calibration phase, during which the measurement is interrupted.

These objectives, as well as others which will become apparent subsequently are achieved according to the invention, with the aid of a device for measuring magnetic field(s), comprising at least one measurement acquisition pathway comprising a measurement current generator, a coil, a measurement resistor, at least one amplifier and at least one antialiasing filter, delivering a measurement voltage, comprising means for determination of at least one electrical quantity representative of said acquisition pathway, said means of determination comprising means of injection of a predetermined calibration current, comprising at least two frequency terms at at least two frequencies distinct from that (those) of said measurement current, said calibration current being superimposed on said measurement current, and calculation means delivering an estimate of said at least one electrical quantity at the frequency or frequencies of said measurement current.

Thus, the invention is based on an entirely novel and inventive approach of calibration, implemented continuously (without interrupting the measurement), which does not influence the measurement performed in the short term, and which considerably improves the long- or medium-term accuracy.

Specifically, the invention is based on the determination of an estimate of at least one electrical quantity representative of the measurement pathway, on the basis of calibration parameters, in such a way as to eliminate the measurement uncertainties and/or the dependence of the measurement on slowly varying parameters, which are known with insufficient or unknown accuracy, such as for example the resistances for measuring the current and the transfer functions of the measurement pathways.

The invention therefore implements calibration signals, which are superimposed on the signals to be measured, and which exhibit spectral components at frequencies distinct from those of the useful signals. It is thus easy to calculate an estimate of an electrical quantity representative of the measurement pathway at the frequency or frequencies of the measurement signals.

According to an advantageous characteristic of the invention, the means of injection of said calibration current are implemented in the course of a calibration cycle, in at least two distinct measurement acquisition pathways.

Advantageously, an electrical quantity representative of the acquisition pathway is the transfer function or the calibration output voltage of the pathway (this voltage being the output voltage of the acquisition pathway when a calibration current (or voltage) is imposed at the input).

The expression calibration cycle is understood to mean a series of injections of the calibration current sequentially, onto the channels of the various acquisition pathways, superposed on the measurement current. The term "calibration cycle" does not designate here the specific calibration phase with halting of emission, such as known and used in the prior art. Specifically, the present invention proposes the implementation of continuous calibration (without interrupting the measurement), for which the calibration current is injected during the measurement of the calibrated channel.

It is therefore possible to calibrate at least two distinct acquisition pathways by injecting a single calibration current successively into each of the pathways, and by implementing just one device generating the calibration current.

According to an advantageous variant of the invention, the means of injection of said calibration current are implemented in the course of a calibration cycle, on the one hand in an emitter of magnetic field(s), and on the other hand in a sensor of magnetic field(s).

In this case, advantageously, the emitter and the sensor defining a reference frame in space each comprise three acquisition pathways, processing means making it possible to determine the position and/or the orientation of the sensor with respect to the emitter.

This characteristic of the invention is especially advantageous in respect of the determination of the orientation of a mobile system with respect to a frame of reference, and in particular in respect of the viewfinders of helmets used in fighter aircraft or combat helicopters, which constitute a favored domain of application of the invention. Specifically, the analysis of the magnetic fields emitted by the emitter and measured by the sensor makes it possible to determine the position and the orientation of the mobile trihedron of the sensor with respect to the fixed trihedron of the emitter.

Advantageously, the means of injection of the calibration current are implemented successively in each of said acquisition pathways in the course of the calibration cycle.

The expression calibration cycle is therefore understood here to mean the injection of the calibration current sequentially into the 6 channels (respectively 3 channels for the emitter and 3 channels for the sensor) superimposed on the feedback current from the sensor or on the emission current from the emitter. Once again, the term "calibration cycle" does not designate a specific calibration phase with halting of emission, such as described in the prior art. The calibration current is, on the contrary, injected during the measurement of the calibrated channel, without interrupting the measurement.

According to an advantageous characteristic of the invention, the means of injection of the calibration current implement a current generator of very large internal impedance controlled by a calibration reference voltage and energizing a calibration current generation resistor, the resistor and the reference voltage being constant for the duration of a calibration cycle.

Thus, the calibration input current which is superimposed, after injection into the acquisition pathways, on the measurement currents has a constant value equal to $V_{cal}/R_{cal}$ throughout the duration of a calibration cycle. It is therefore the same for each of the channels, respectively measurement channel for the sensor and emission channel for the emitter. This characteristic of the invention therefore allows simplified processing, during the implementation of the means for calculating the estimate of the transfer functions and/or the calibration output voltages of the various acquisition pathways.

According to a preferred embodiment of the invention, the calculation means implemented according to the invention perform at least some of the following operations:

measurement of the measurement voltage corresponding to the frequencies of the calibration current;

estimation of the calibration output voltage at the measurement frequency or frequencies;

determination of an estimate of an electrical quantity representative of the acquisition pathway;

determination of a relation between the estimate of electrical quantity representative of the acquisition pathway, the measurement voltage, the measurement current, the measurement resistance, the calibration resistance, the calibration current and the calibration reference voltage;

calculation of a 3×3 matrix of the ratios of the measurement currents of the sensor to the measurement currents of the emitter.

The obtaining of this matrix affords easy access to the rotation matrix of the frame of reference tied to the sensor with respect to the frame of reference tied to the emitter, and therefore leads to the determination of the position and of the orientation of the sensor in the frame of reference tied to the emitter.

According to an advantageous technique of the invention, the calculation means making it possible to obtain an estimate of the calibration voltage or of the transfer function at the frequency or frequencies of measurement may implement processes such as polynomial interpolation or multiple linear regression (that is to say the estimate of the optimal value in the sense of the least squares of the parameters of a polynomial or nonpolynomial function). More generally, the invention can also implement any technique making it possible to obtain an estimate of the optimal parameters of the transfer function at the frequency or frequencies of measurement, from the values of the transfer functions at the frequencies of the calibration signals. This also applies to the model of the calibration output voltage for the measurement frequency or frequencies from the values of this output voltage at the calibration frequencies.

Advantageously, in at least some of the acquisition pathways, the measurement resistor is replaced with a single measurement resistor common to said at least some acquisition pathways.

The invention makes it possible in particular to embody an emitter in which the three resistors of each of the three channels are grouped together as a single resistor, this being especially beneficial in the industrial realization of the invention.

The invention also relates to a process for measuring magnetic field(s), implementing at least one measurement acquisition pathway comprising a measurement current generator, a coil, a measurement resistor, at least one amplifier, and at least one antialiasing filter delivering a measurement voltage, and implementing a step of determination of at least one electrical quantity representative of said acquisition pathway, comprising a step of injection of a predetermined calibration input current, comprising at least two frequency terms at at least two frequencies distinct from that (those) of said measurement current, said calibration input current being superimposed on said measurement current, a step of calculation delivering an estimate of said at least one electrical quantity at the frequency or frequencies of said measurement current.

The present invention may advantageously find applications in numerous domains, and in particular in at least one of the following domains:

precision compasses used for measuring the magnetic heading in navigation;

servocontrolled fluxmeter sensors;

determination of the position and of the orientation of a mobile craft moving (translation and/or rotation) in a frame of reference, for example for a helmet viewfinder in aviation;

detection of magnetic masses in relative motion with respect to a sensor;

metrological measurements of magnetic fields;

measurements in a variable thermal environment.

More generally, the invention can find applications in any domain in which it is necessary to make very accurate measurements of magnetic field(s), and in particular three-axis measurements. The invention can also be implemented in equipment for measuring magnetic field(s) intended to have considerable lifetimes. Specifically, the process and the device implemented according to the invention offer the assurance of a negligible effect from the aging of the components of all the measurement and acquisition pathways.

Other characteristics and advantages of the invention will become more clearly apparent on reading the following description of a preferred embodiment, given by way of simple illustrative and nonlimiting example, and of the appended drawings, among which:

The general principle of the invention is based on the superimposing of calibration signals on the useful signals to be measured, the domain of frequencies of the calibration signals being disjoint from the domain of frequencies of the measurement signals.

A favored domain of application of the present invention is the determination of an orientation tied to a mobile system, for example to a helmet viewfinder used in fighter aircraft or combat helicopters.

An embodiment of a device for measuring magnetic field(s) implementing means of continuous calibration, for a helmet viewfinder, is presented in conjunction with FIGS. 1 to 4.

As mentioned previously, a device for measuring orientation and position of the helmet of the pilot in a reference frame tied to the aircraft can consist of an orientation and position measuring sensor consisting of three orthogonal electromagnetic coils and placed on the helmet, and of an emitter, situated at a fixed point of the cabin, and consisting of three other electromagnetic coils.

Figure 1:
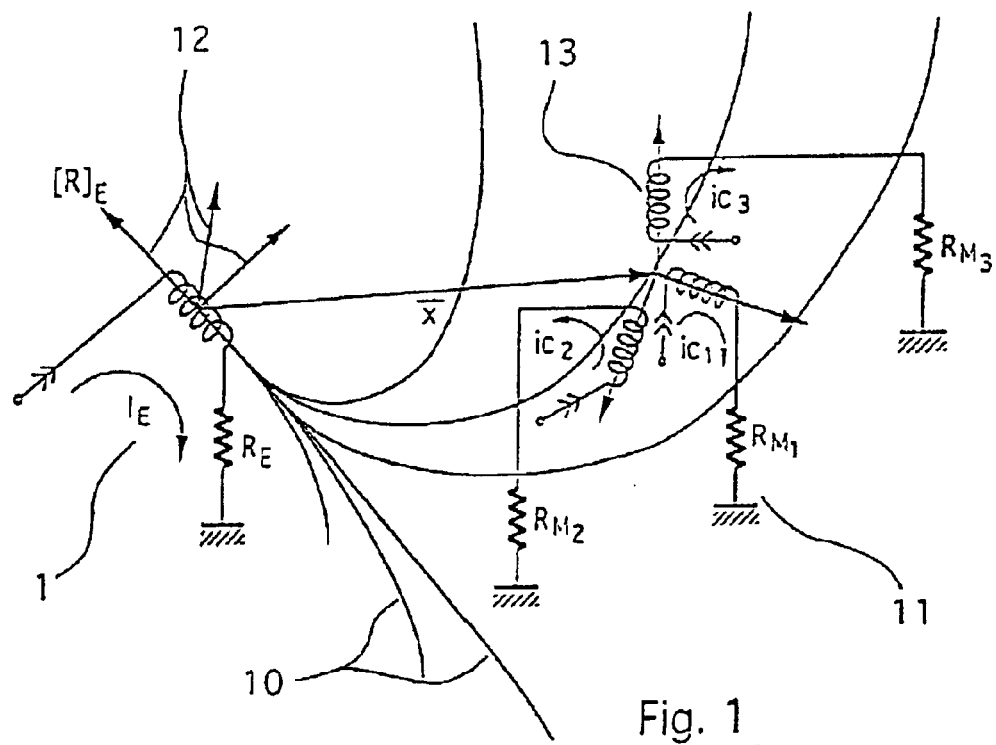
FIG. 1 depicts a magnetic sensor comprising three substantially orthogonal coils, and a coil emitting an induction (one out of the three constituent coils of an emitter), according to the device implemented in a helmet viewfinder.

The object of the measurement implemented according to FIG. 1 therefore consists in determining the position and the orientation of a magnetic sensor 11 in the orthonormal reference frame $[R]_E$ 12 formed by the 3 coils of the emitter 1 of magnetic field $\overline{B}_E(\overline{x})$. It will be noted, for the sake of clarity and simplification, that only one emission coil has been represented in FIG. 1. The generalization to three coils is immediate.

At the point $\overline{x}$, which indicates the position of the sensor 11 in the reference frame $[R]_E$, the induction $\overline{B}_E(\overline{x})$ is projected onto the 3 axes of the detection and feedback coils 13 of the sensor. The feedback currents $i_{c1}$, $i_{c2}$ and $i_{c3}$ implemented in the sensor 11 cancel out these projections, through a servocontrol process known to the person skilled in the art. $i_{c1}$, $i_{c2}$ and $i_{c3}$ therefore represent the measurements of magnetic induction along the directions of the axes of the sensor.

Specifically, for an emission on a single coil such as represented in FIG. 1, it is known that at a point $\overline{x}$ in space, for an orthonormal emitter and an orthonormal sensor, the sensor 11 measures:

$$\begin{pmatrix} i_{c1} \\ i_{c2} \\ i_{c3} \end{pmatrix} = k(R^t_{CIE}) \begin{pmatrix} f_1(\overline{x}) \\ f_2(\overline{x}) \\ f_3(\overline{x}) \end{pmatrix} i_E \quad (1)$$

where $R'_{CIE}$ is the transposed matrix of the matrix for switching from the emitter frame of reference to the sensor frame of reference, and formed of the unit vectors of the sensor axes expressed in the emitter frame of reference and k a proportionality term dependent on the units chosen, $f_1(\overline{x})$, $f_2(\overline{x})$, $f_3(\overline{x})$ being the components of $\overline{B}_E(\overline{x})$ at the point $\overline{x}$ in the frame of reference $12[R]_E$ formed by the emitter 1 for a unit emission current.

By taking the ratios $$\frac{i_{c1}}{i_E}, \frac{i_{c2}}{i_E}, \frac{i_{c3}}{i_E}$$

(where $i_E$ is the emission current), only the information regarding position $\overline{x}$ and rotation X, Y, Z of the sensor 11 still remains in the expression for the measurement (1) above. In the more general case of three emissions along the three axes of the emitter, the obtaining of the 3×3 matrix of generic term $i_{ci}/i_{Ej}$, where i and j are indices of value 1 to 3, therefore affords easy access to the orientation and to the position of the sensor 11 in the frame of reference 12 of the emitter 1.

Figure 2:
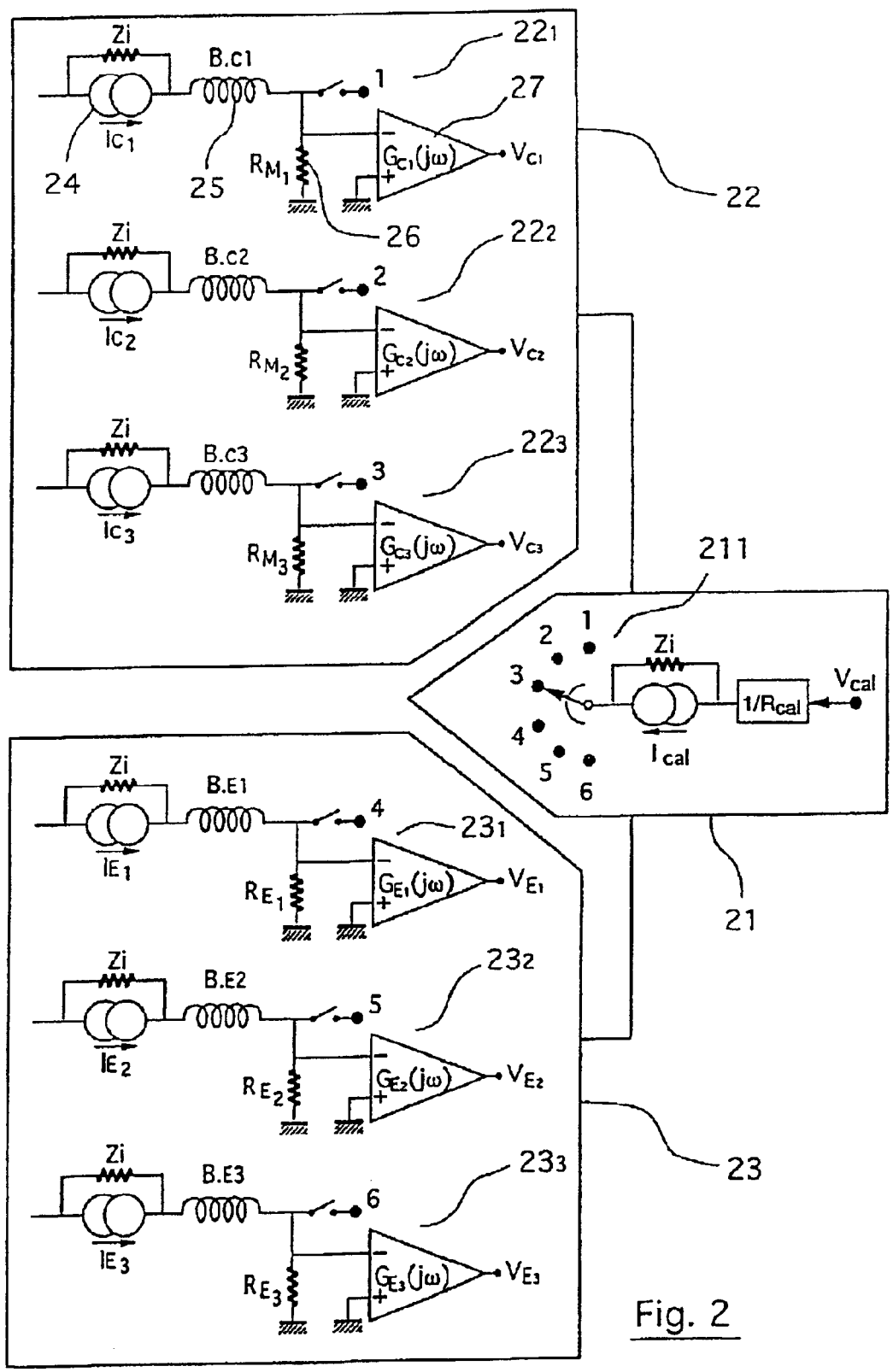
FIG. 2 illustrates the measurement acquisition pathways and the calibration means implemented according to the invention to improve the accuracy of the measurement performed in the system depicted in FIG. 1.

According to the invention, the measurement of the currents $i_{c1}$, $i_{c2}$, $i_{c3}$ and $i_{Ej}$ can be achieved accurately by implementing a calibration whose simplified layout is illustrated in FIG. 2.

Represented diagrammatically are the three pathways $22_1$ to $22_3$ of the sensor, and the three pathways $23_1$ to $23_3$ of the emitter. Each pathway exhibits a current generator 24, of quasi-infinite impedance $Z_i$, a coil 25, a terminal (numbered from 1 to 6) for connection with the calibration module 21, a resistor 26 ($R_{Mi}$ or $R_{Ei}$) and an amplifier 27 delivering voltages $V_{ci}$ and $V_{Ei}$ respectively. The calibration module 21 comprises a resistor $R_{cal}$ and a current generator $I_{cal}$, of quasi-infinite internal impedance $Z_i$. Splitting means 211 alternately inject onto the terminals 1 to 6 of the resistors $R_{M1}$, $R_{M2}$, $R_{M3}$, $R_{E1}$, $R_{E2}$ and $R_{E3}$ a current $I_{cal}=V_{cal}/R_{cal}$ which is superimposed on the currents to be measured $i_{c1}$, $i_{c2}$, $i_{c3}$, in the sensor, and $i_{E1}$, $i_{E2}$, $i_{E3}$ in the emitter.

So as not to disturb the measurement of these currents, current generators 24 are employed in the feedback loop of the sensor on the one hand, and in each of the emission pathways of the emitter on the other hand. The main characteristic of these current generators is that they have a quasi-infinite internal impedance $Z_i$. Thus, the calibration current is added in the resistors $R_{M1}$, $R_{M2}$ and $R_{M3}$ to the measurement currents without errors and without disturbing the feedback of the sensor. In the same manner, the calibration current is added without disturbance to the emission currents in the resistors $R_{E1}$, $R_{E2}$ and $R_{E3}$.

For an emission pathway, we therefore have:

$$V_E = G_E(\omega) R_E (i_E + i_{cal})$$

Additionally, the frequency domain of the calibration signal is, according to the invention, disjoint from the frequency domain of the emission currents in the emission antenna. One way of carrying out the calibration is, for example, to inject a current whose frequency characteristics are as follows: the current $i_{cal}$ comprises only frequency terms at various angular frequencies $\omega_i$, while the measurement current is at an angular frequency $\omega_0$ or at angular frequencies $\omega_{0j} \neq \omega_i$.

$i_E$ and $i_{cal}$ are separated in terms of frequency (for example by FFT (standing for "Fast Fourier Transform") or by synchronous detection) and the expression for all the measured voltages is then of the type:

$$V_E^{(1)} = G_E(\omega_0) R_E i_E$$

and $V_E^{(2)} = G_E(\omega_i) R_E i_{cal}$

From this we then deduce the estimated transfer function $G_E(\omega)^* R_E$ at the angular frequency emitted $\omega_0$ in a known manner, by polynomial estimation for example in the frequency domain, hence $$\frac{i_E}{i_{cal}} \cong \frac{V_E^{(1)}(\omega_0)}{\hat{V}_E^{(2)}(\omega_0)}$$

in which $\hat{V}_E^{(2)}(\omega_0)$ is the estimate of $V_E^{(2)}$ for the frequency of $i_E$, to within the error made in the estimate of $$R_E G_E(\omega_0) = \frac{V_E^{(2)}}{i_{cal}}.$$

We can also estimate $V_E^{(2)}(\omega_0)$ denoted $\hat{V}_E^{(2)}(\omega_0)$ by polynomial modeling in a similar manner on the basis of values $V_E^{(2)}(\omega_i)$ for at least two values $\omega_i$:

$$V_E^{(2)}(\omega_i) \to \hat{V}_E^{(2)}(\omega_0) = f(R_E G_E(\omega_i) i_{cal})$$

$$= \widehat{R_E G_E}(\omega_0) i_{cal}$$

with $i_{cal}(\omega)$=constant=$i_{cal}$
where $$\widehat{R_E G_E}$$

is an approximation function whose parameters are estimated in an optimal manner by interpolation or by fitting by least squares, in a known manner.

$$\widehat{R_E G_E}$$

is a linear function or a nonlinear function of the type of the customary transfer functions $$\frac{N(\omega)}{D(\omega)}$$

where $N(\omega)$ and $D(\omega)$ are polynomials in $\omega$ of orders n and p with $n \leq p$.

Figure 3:
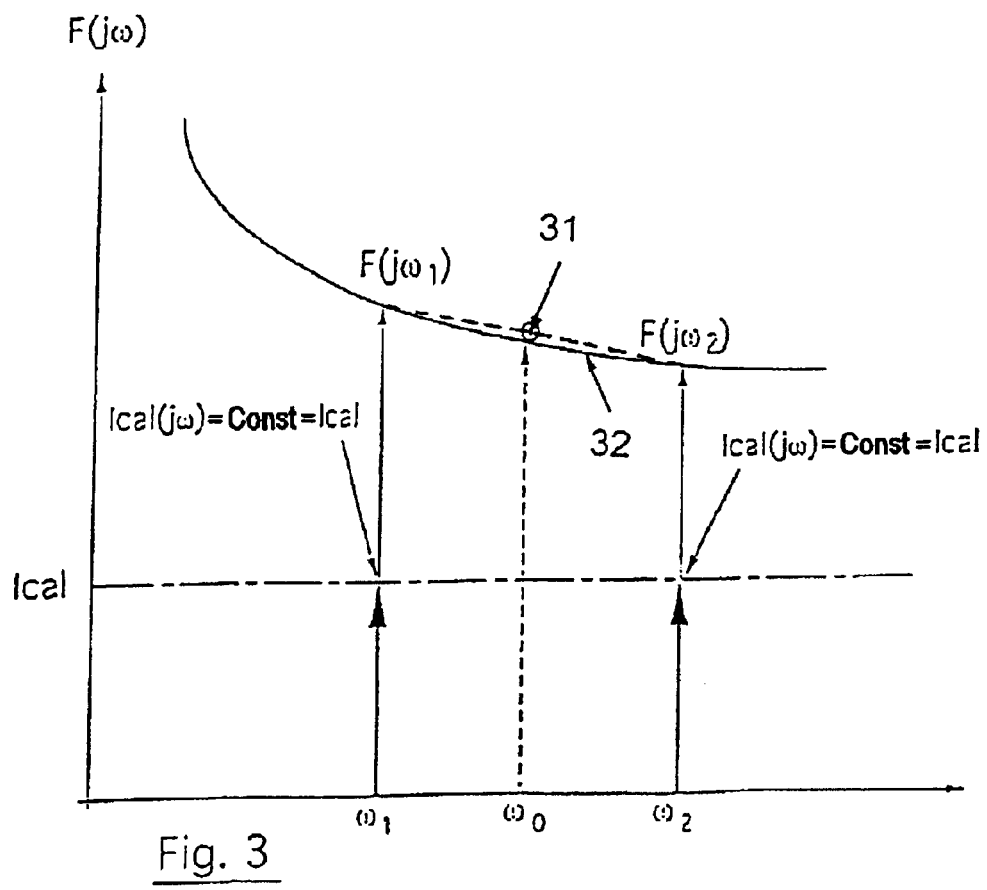
FIG. 3 depicts the principle of the method of determining an estimate of the transfer function of a measurement acquisition pathway depicted in FIG. 2.

Moreover, $V_E^{(1)}(\omega_0) = R_E G_E(\omega_0) i_E(\omega_0)$ hence $\frac{V_E^{(1)}(\omega_0)}{\hat{V}_E^{(2)}(\omega_0)} \# \frac{i_E(\omega_0)}{i_{cal}}$ FIG. 3 depicts the method making it possible to access the estimate, for example by linear interpolation, of the transfer function or of the calibration output voltage $$\hat{V}_E^{(2)}(\omega_0),$$

at the frequency emitted, in the particular case where the calibration current comprises only two frequency terms, one at $\omega_1$ and the other at $\omega_2$, while the measurement current is at $\omega_0$. We adopt the notation $F(j\omega)=R_E^*G(j\omega)$ where $$j = \sqrt{-1}.$$

F can also represent to within $i_{cal}$ the calibration voltage $$\hat{V}_E^{(2)}(\omega_0).$$

In FIG. 3, 31 represents the linearly interpolated function $F(j\omega_0)$, and 32 represents $F(j\omega_0)$ fitted as a nonlinear function.

It is possible to proceed, for the measurement current in the acquisition pathways of the sensor in the same manner as for the emission current:

$V_c = G_c(\omega).R_M(i_c + i_{cal})$, equality from which is deduced, after frequency separation:

$$V_c^{(1)}(\omega_0) \to V_c^{(1)}(\omega_0) = G_c(\omega_0).R_M i_c(\omega_0)$$

$$V_c^{(2)}(\omega_0) \to V_c^{(2)}(\omega_i) = G_c(\omega_i).R_M i_{cal}(\omega_i)$$

On the basis of several angular frequencies $\omega_i$, we estimate the value of $\hat{V}_c(\omega_0) = f(G_c(\omega_i) R_M i_{cal}(\omega_i))$:

$$\hat{V}_c(\omega_0) = \hat{G}_c(\omega_0) R_M i_{cal}(\omega_0)$$

with: $i_{cal}(\omega_i) = i_{cal}$ = constant $\forall i$.

By evaluating the ratio:

$$\frac{V_c(\omega_0)}{\hat{V}_c(\omega_0)} = \frac{G_c(\omega_0) R_M i_c(\omega_0)}{\hat{G}_c(\omega_0) R_M i_{cal}(\omega_0)} \approx \frac{i_c(\omega_0)}{i_{cal}}$$

to within the estimation error of $\hat{G}(\omega_0)$.

We can then evaluate the following ratio:

$$\left(\frac{i_c}{i_{cal}}\right) / \left(\frac{i_E}{i_{cal}}\right) = \frac{i_c}{i_E} = \frac{V_c(\omega_0)}{\hat{V}_c(\omega_0)} \frac{\hat{V}_E(\omega_0)}{V_E(\omega_0)} \quad (2)$$

and we note that if the acquisition pathways of the emitter and of the sensor are substantially identical, $$\frac{\hat{V}_E(\varpi_0)}{\hat{V}_c(\varpi_0)}$$

is substantially constant in the useful frequency domain. This is not necessary but aids accuracy.

It may moreover be noted that $G_{E(j)}$ and $G_{c(j)}$ are in fact complex functions of $(j\omega)$: $G_{E(j)}(j\omega)$ and $G_{c(j)}(j\omega)$.

The calibrated measurements of equation (2) therefore no longer depend on the calibration reference voltage $V_{cal}$, or on the calibration current generation resistance $R_{cal}$ provided that these two quantities are constant throughout the duration of the calibration cycle.

Moreover, the measurements no longer depend on the resistors for measuring the currents ($R_{Mi}$ and $R_{Ej}$) or on the acquisition transfer functions of the channels for sensor measurements $G_{Cj}$ or for measuring the current $G_{Ej}$.

We therefore obtain, according to the invention, calibrated measurements of the ratios $i_{ci}/i_{Ej}$, which make it possible to determine, accurately, the position and the orientation of the sensor placed on the helmet of the pilot, in the frame of reference tied to the emitter fixed in the aircraft.

The embodiment preferentially adopted is that consisting in estimating the calibration voltage at the measurement frequency or frequencies, in preference to the embodiment consisting in estimating the transfer function at the measurement frequency or frequencies. Specifically, the model of the exact measurement may be written:

$$V_s(j\omega) = R_m \cdot G_m(j\omega) \cdot [i_m(j\omega) + i_{cal}(j\omega) + i_b(j\omega)] + b_n(j\omega)$$

where $i_b(j\omega)$ is current-related noise, $b_n(j\omega)$ is voltage-related noise of the measurement pathway, $V_s(j\omega)$ is the output voltage of one of the pathways $22_1$ to $22_3$ and $23_1$ to $23_3$ represented in FIG. 2 ($V_s(j\omega)$ therefore denotes any one of the voltages $V_{c1}$ to $V_{c3}$ and $V_{E1}$ to $V_{E3}$ of FIG. 2), and the index m is a generic term for denoting the emission pathway (index E) or the pathway of the sensor (index c).

$i_b(j\omega)$ has to be decomposed:

into current-related noise of the generator of the current to be measured ($i_{E_j}$ or $i_{c_i}$), i.e. $i_{b-m}(j\omega)$ (for $i_{b-c}$ and $i_{b-E}$)

and into current-related noise of the generator of the calibration current, i.e. $i_{b-cal}$.

All noise may be assumed locally white (that is to say that its spectral density is constant in the neighboring measurement and calibration domains).

Consequently, in the course of a calibration cycle, apart from the series of injections of the calibration current sequentially, onto the channels of the various acquisition pathways, superimposed on the measurement current, and the associated processings mentioned previously, such as the determination of an estimate of the transfer function or of the calibration voltage at the measurement frequency or frequencies, other processings are implemented, such as:

the calculation of the noise in the absence of any calibration current; the calibration circuit being assumed open and $V_{cal}$ injected zero, on the channels which are uncalibrated at the instant t, we have, at the calibration frequencies:

$$V_{s-m}^{(0)}(j\omega_i) = R_m \cdot G_m(j\omega_i) i_{b-m}(j\omega_i) + b_n(j\omega_i) \quad (3)$$

From this we deduce $\hat{V}_{s-m}^{(0)}(j\omega_0)$ by interpolation or linear regression.

the calculation of the noise of the calibration current when the circuit for injecting the current is closed on the channel calibrated at the instant t but with a value of $i_{cal} = 0$ (= $V_{cal}/R_{cal}$). We then have:

$$V_{s-cal}^{(0)}(j\omega_i) = R_m \cdot G_m(j\omega_i)[i_{b-cal}(j\omega_i) + i_{b-m}(j\omega_i)] + b_n(j\omega_i)$$

Thus, in the course of a calibration cycle, calibration current $i_{cal}$ is injected sequentially, onto the channels of the various acquisition pathways, superimposed on the measurement current, and we have:

$$V_{s-cal}(j\omega_i) = R_m \cdot G_m(j\omega_i)[i_{b-cal}(j\omega_i) + i_{b-m}(j\omega_i) + i_{cal}(j\omega_i)] + b_n(j\omega_i)$$

We then calculate:

$$V_{s-cal}^*(j\omega_i) = V_{s-cal}(j\omega_i) - V_{s-cal}^{(0)}(j\omega_i) = R_m \cdot G_m(j\omega_i) i_{cal}(j\omega_i)$$

According to equation (2), for the measurement of the currents to be measured:

$$V_{s-m}^{(0)}(j\omega_i) = R_m \cdot G_m(j\omega_i) i_{b-m}(j\omega_i) + b_n(j\omega_i)$$

from which we deduce:

$$\hat{V}_{s-m}^{(0)}(j\omega_0) = R_m \cdot \hat{G}_m(j\omega_0) \hat{i}_{b-m}(j\omega_0) + \hat{b}_n(j\omega_0) \text{ estimated}$$

We assume:

that $\hat{b}_n(j\omega_0) \# b_n(j\omega_i) \forall \omega_i$ around $\omega_0$, and that $\hat{i}_{b-m}(j\omega_0) \# i_{b-m}(j\omega_i) \forall \omega_i$ around $\omega_0$.

Hence $\hat{V}_{s-m}^{(0)}(j\omega_0) \# R_m \cdot \hat{G}_m(j\omega_0) i_{b-m}(j\omega_0) + b_n(j\omega_0)$.

We then calculate $$V_{s-m}^*(j\omega_0) = V_{s-m}(j\omega_0) - \hat{V}_{s-m}^{(0)}(j\omega_0)$$

$$V_{s-m}^*(j\omega_0) = R_m \cdot G_m(j\omega_0) i_m(j\omega_0)$$

$$+ R_m \cdot G_m(j\omega_0) i_{b-m}(j\omega_0) - R_m \cdot \hat{G}_m(j\omega_0) \hat{i}_{b-m}(j\omega_0)$$

$$+ b_n(j\omega_0) - \hat{b}_n(j\omega_0)$$

hence $V_{s-m}^*(j\omega_0) \# R_m G_m(j\omega_0) i_m(j\omega_0)$

To take account of the noise, we must therefore substitute, in the previous processings making it possible to access the 3×3 matrix of generic term $i_{ci}/i_{Ej}$, $V_E^{*(1)}(\omega_0)$ and $V_c^{*(1)}(\omega_0)$, calculated according to a technique similar to that employed for the calculation of $V_{s-m}^*$, for $V_E^{(1)}(\omega_0)$ and $V_c^{(1)}(\omega_0)$ respectively. Likewise, we replace $V_E^{(2)}(\omega_i)$ and $V_c^{(2)}(\omega_i)$ by $V_E^{*(2)}(\omega_i)$ and $V_c^{*(2)(\omega_i)}$, which we use to deduce the relations:

$$\hat{V}_E^{*(2)}(\omega_0) = \hat{V}_{E-cal}^*(\omega_0)$$

and $\hat{V}_c*^{(2)}(\omega_0)=\hat{V}_{c-cal}*(\omega_0)$

We thus end up at formula (2).

Figure 4:
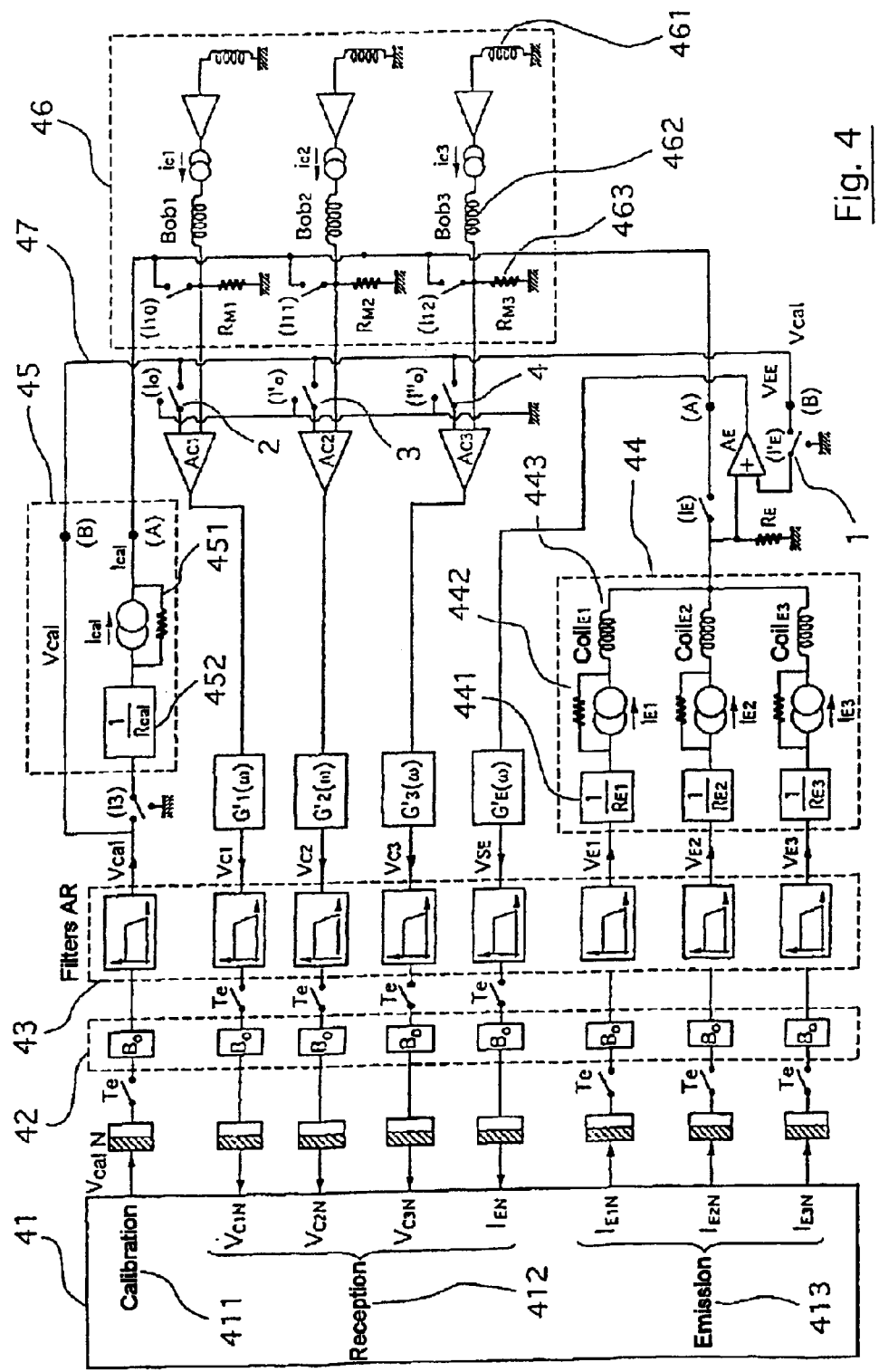
FIG. 4 depicts a schematic of the device implemented in a helmet viewfinder, comprising the sensor and the emitter which are depicted in FIG. 1, the measurement acquisition pathways and the calibration means illustrated in FIG. 2, and the means of calculating the transfer function, according to FIG. 3.

FIG. 4 depicts a schematic of the overall device implemented in a helmet viewfinder. The various constituent elements of this device are not discussed in detail, these being either known or discussed previously.

It will however be noted that such a device comprises an acquisition and processing computer 41, which manages the calibration signals 411, the measurement signals at reception 412 and the emission signals 413, i.e. four reception channels and four emission channels. Each channel comprises means for sampling the signals at the period $T_E$, a blocker of order zero 42, and an antialiasing filter 43.

A magnetic field emitter 44 comprises 3 acquisition pathways numbered from 1 to 3 consisting of a current generator 442, an emission coil 443 and a conductor 441. The three emission coils 443 are linked at a common point $P_C$ on which the three currents $i_{E1}, i_{E2}, i_{E3}$ are summed. The voltage $V_{EE}$ equals $R_E \cdot (i_{E1}+i_{E2}+i_{E3})$. This method is made possible by the fact that the impedance $Z_i$ of the three current generators 442 tends to infinity: $Z_i \gg 1000 \cdot R_E$. This embodiment makes it possible to simplify the implementation of the electronics for measuring the emission current Specifically, there is now just one resistor $R_E$ and just one transfer function $G_E(\omega)$. Such an embodiment also makes it possible to reduce the complexity and the duration of the calibration cycle.

A magnetic sensor 46 comprises 3 measurement acquisition pathways numbered from 1 to 3 comprising a detection coil 461, a feedback coil 462 and a measurement resistor 463. The calibration signal $I_{cal}$ is generated with the aid of a device comprising a calibration current generator 451 and a calibration resistor 452.

The device further comprises a calibration voltage circuit 47. Such a calibration voltage makes it possible, if it is planned in the calibration cycle, to measure the ratio $R/R_{cal}$, R denoting any one of the resistors $R_E$, $R_{M1}$, $R_{M2}$ and $R_{M3}$. This makes it possible to monitor the drifting of the ratios $$\frac{R_{Mi}}{R_E}$$

between the resistors.

By neglecting all noise, the principle of the measurement is then the following: at the so-called calibration frequencies $\omega_I$, we have:

for $i_{cal}=0$ and $V_{cal} \neq 0$ at the inputs $A_E$, $A_{c1}$, $A_{c2}$, $A_{c3}$ sequentially or otherwise, we have:

$$V_{E-cal}^V(\omega_i)=G_E(\omega_i)V_{cal}(\omega_i)=G_E(\omega_i)R_{cal}i_{cal}(\omega_i) \quad (4)$$

for $i_{cal} \neq 0$ and $V_{cal}=0$ at the inputs $A_E$, $A_{c1}$, $A_{c2}$, $A_{c3}$ sequentially or otherwise, on the points 1, 2, 3, 4 of FIG. 4 sequentially, we have:

$$V_{E-cal}^i(\omega_i)=G_E(\omega_i)R_E i_{cal}(\omega_i).$$

By calculating the ratio $$\frac{V_{E-cal}^i}{V_{E-cal}^V},$$

we deduce $R_E/R_{cal}$.

We would proceed in the same way for $$\frac{R_{M1}}{R_{cal}}, \frac{R_{M2}}{R_{cal}}, \frac{R_{M3}}{R_{cal}}.$$

Figure 5A:
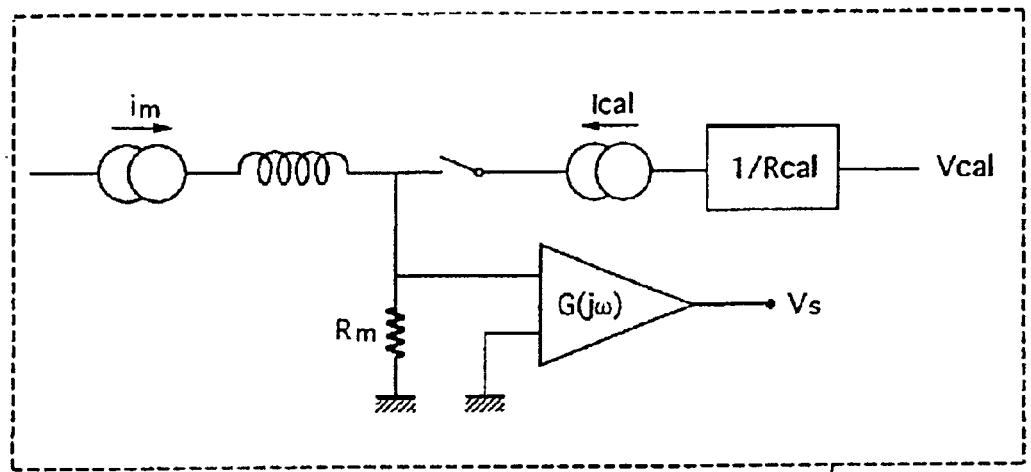
FIG. 5a depicts a nondifferential layout of an embodiment of the present invention.

It will be noted that the description of the various embodiments of the invention has been illustrated with the aid of nondifferential layouts, such as the layout 51 of FIG. 5a. Obviously, the invention applies equally to differential layouts such as the layout 52 of FIG. 5b. The injections of current at the points 521 and 522 are then carried out, for example, sequentially over time.

Figure 5B:
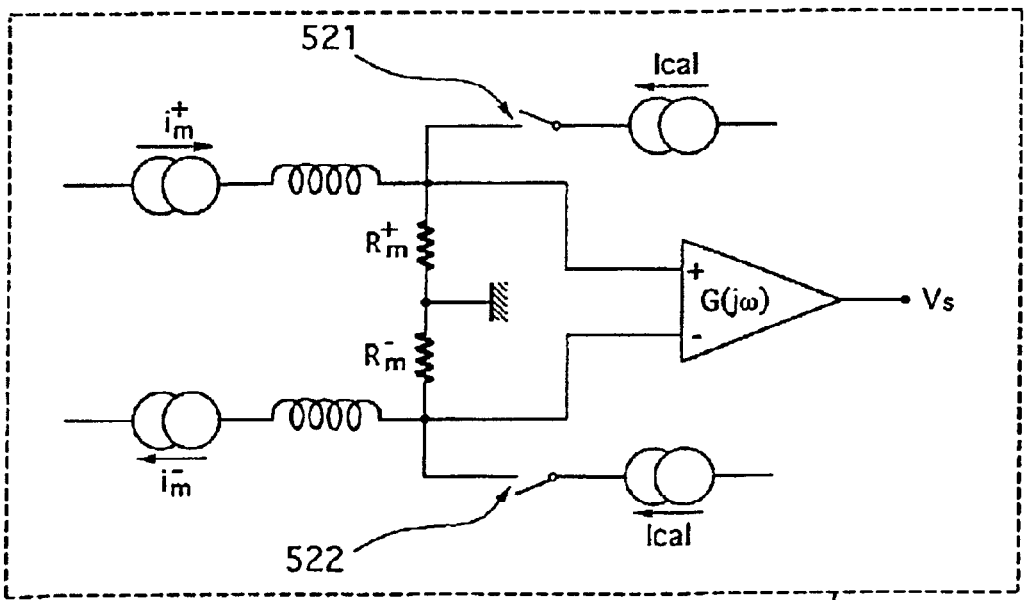
FIG. 5b depicts a differential layout of an embodiment of the present invention.

In FIGS. 5a and 5b, the current $i_m$ denotes any one of the currents $i_{ci}$ or $i_{Ej}$, the resistance $R_m$, any one of the resistances $R_{ci}$ or $R_{Ej}$, and the voltage $V_s$, any one of the voltages $V_{ci}$ or $V_{Ej}$.

It will also be noted that the evaluation of $R_E/R_{cal}$ makes it possible, if $R_{cal}$ is a precision resistor, to monitor the value of $R_E$. It is thus possible to place several resistors $R'_E$ of like value in parallel $$\frac{1}{R_E} = \sum_i \frac{1}{R'_{E_i}}.$$

This placement in parallel makes it possible to increase the values of $R'_E$, to decrease their power-withstand specification, this being favorable. The increase in inaccuracy and in drift is compensated for by the calibration process, which is the subject of the present invention.

What is claimed is:

1. A device for measuring at least one magnetic field, comprising:
   at least one measurement acquisition pathway comprising a measurement current generator, a coil, a measurement resistor, at least one amplifier, and at least one antialiasing filter configured to deliver a measurement voltage;
   means for determining at least one electrical quantity representative of the acquisition pathway, the means for determining comprising means for providing a predetermined calibration current including at least two frequency terms at at least two frequencies distinct from a frequency of a measurement current, the predetermined calibration current configured to be superimposed on the measurement current; and
   means for delivering an estimate of the at least one electrical quantity at the frequency of the measurement current.

2. The device as claimed in claim 1, wherein the at least one electrical quantity representative of the acquisition pathway comprises one of a transfer function of the acquisition pathway and a calibration output voltage of the acquisition pathway.

3. The device as claimed in claim 1, wherein the means for providing the predetermined calibration current is configured to be implemented in a calibration cycle, in at least two distinct measurement acquisition pathways.

4. The device as claimed in claim 3, wherein the means for providing the predetermined calibration current is configured to be implemented successively in each of the acquisition pathways in the calibration cycle.

5. The device as claimed in claim 3, wherein the means for providing the predetermined calibration current is configured to implement a current generator of very large internal impedance controlled by a calibration reference voltage and energizing a calibration current generation resistor, the internal impedance and the calibration reference voltage being constant for a duration of the calibration cycle.

6. The device as claimed in claim 5, wherein the calculation means is configured to perform at least one of:

measurement of the measurement voltage corresponding to frequencies of the predetermined calibration current;

estimation of a calibration output voltage at a measurement frequency;

determination of an estimate of an electrical quantity representative of the acquisition pathway;

determination of a relation between the estimate of the representative electrical quantity, the measurement voltage, the measurement current, the measurement resistance, the calibration resistance, the predetermined calibration current, and the calibration reference voltage;

calculation of a 3×3 matrix of ratios of measurement currents of the sensor to measurement currents of the emitter.

7. The device as claimed in claim 3, wherein the measurement resistor is common to the two acquisition pathways.

8. The device as claimed in claim 1, wherein the means for providing the predetermined calibration current is configured to be implemented in a calibration cycle, in an emitter of the at least one magnetic field, and in a sensor of the at least one magnetic field.

9. The device as claimed in claim 8, wherein the emitter and the sensor are configured to define a reference frame in space, and the emitter and the sensor each comprise three acquisition pathways, and the device further comprises:

means for determining a position and orientation of the sensor with respect to the emitter.

10. The device as claimed in claim 1, wherein the calculation means is configured to implement at least one of polynomial interpolation and multiple linear regression.

11. The device as claimed in claim 1, wherein the device is configured to be applied to at least one of:

precision compasses used for measuring magnetic heading in navigation;

servocontrolled fluxmeter sensors;

determination of position and of orientation of a mobile craft moving in a frame of reference;

detection of magnetic masses in relative motion with respect to a sensor;

metrological measurements of magnetic fields; and measurements in a variable thermal environment.

12. A process for measuring at least one magnetic field, implementing at least one measurement acquisition pathway including a measurement current generator, a coil, a measurement resistor, at least one amplifier, and at least one antialiasing filter delivering a measurement voltage, the process comprising:

determining at least one electrical quantity representative of the acquisition pathway;

delivering a predetermined calibration current including at least two frequency terms at at least two frequencies distinct from a frequency of a measurement current, the calibration current being superimposed on the measurement current; and calculating an estimate of the at least one electrical quantity at the frequency of the measurement current.

13. The process as claimed in claim 12, further comprising:

applying the process to at least one of:

precision compasses used for measuring magnetic heading in navigation;

servocontrolled fluxmeter sensors;

determination of position and of orientation of a mobile craft moving in a frame of reference;

detection of magnetic masses in relative motion with respect to a sensor;

metrological measurements of magnetic fields; and measurements in a variable thermal environment.

* * * * *